(12) United States Patent
Krecinic et al.

(10) Patent No.: US 8,378,319 B2
(45) Date of Patent: Feb. 19, 2013

(54) SYSTEM AND METHOD FOR GENERATING DIRECT-WRITE PATTERN

(75) Inventors: Faruk Krecinic, Hsin Chu (TW); Shy-Jay Lin, Jhudong Township, Hsinchu County (TW); Jeng-Horng Chen, Hsin-Chu (TW); Shih-Ming Chang, Hsinchu (TW); Tuane Ying Fang, Hsinchu (TW); Wei-Long Wang, Hsin-Chu (TW); Chien-Hsun Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 291 days.

(21) Appl. No.: 12/728,655

(22) Filed: Mar. 22, 2010

(65) Prior Publication Data
US 2011/0226970 A1  Sep. 22, 2011

(51) Int. Cl.
*G09G 5/39* (2006.01)
*H01J 37/00* (2006.01)
(52) U.S. Cl. .................... 250/492.22; 345/443
(58) Field of Classification Search ............... 250/492.1, 250/492.2, 492.22
See application file for complete search history.

(56) References Cited

U.S. PATENT DOCUMENTS

| 4,531,191 A | 7/1985 | Koyama |
| 4,806,921 A | 2/1989 | Goodman et al. |
| 4,837,447 A * | 6/1989 | Pierce et al. ............... 250/492.2 |
| 5,446,836 A | 8/1995 | Lentz et al. |
| 6,049,672 A * | 4/2000 | Shiell et al. .................... 717/168 |
| 2008/0121939 A1* | 5/2008 | Murray et al. ................ 257/202 |
| 2010/0078556 A1* | 4/2010 | Fujita et al. ................... 250/310 |

FOREIGN PATENT DOCUMENTS
WO  2009147202 A1  12/2009

* cited by examiner

*Primary Examiner* — Jack Berman
*Assistant Examiner* — Eliza Osenbaugh-Stewart
(74) *Attorney, Agent, or Firm* — Haynes and Boone, LLP

(57) ABSTRACT

A direct-write system is provided which includes a stage for holding a substrate, a processing module for processing pattern data and generating instructions associated with the pattern data, and an exposure module that includes beams that are focused onto the substrate and a beam controller that controls the beams in accordance with the instructions. The processing module includes vertex pair processors each having bit inverters. Each vertex pair processor is operable to process a respective vertex pair of an input scan line to generate an output scan line. Each bit inverter is operable to invert a respective input bit of the input scan line to generate a respective output bit of the output scan line if a bit position is located between the respective vertex pair, otherwise the respective input bit is copied to the respective output bit. The instructions correspond to the output bits for each beam.

20 Claims, 11 Drawing Sheets

SYSTEM AND METHOD FOR GENERATING DIRECT-WRITE PATTERN

BACKGROUND

The present disclosure relates generally to semiconductor manufacturing and, more particularly, to a system and method for direct writing to a wafer.

Photolithography or optical lithography is generally known as a process that is used in micro fabrication to selectively remove parts of thin films on a substrate. Photolithography generally uses a directed light source to transfer a geometric pattern from a photomask to a light-sensitive chemical resist material that is formed on the substrate, thus generating an exposure pattern in the resist material from the light radiation. A series of chemical treatments may then be used to etch or otherwise transfer the exposure pattern into one or more thin film layers positioned underneath the resist layer.

More recent lithography-type systems for micro fabrication operate to transfer or generate an exposure pattern in a resist layer without the intermediary step of creating a photomask. For example, a direct-write (DW) exposure tool operates to write patterns directly into one or more layers on a substrate (without a photomask or reticle). The pattern is generally written from an electronic or computer-type file that is used to control a precision exposure source that may be selectively directed onto the layers of the substrate. More particularly, a DW exposure tool is generally configured such that the exposure of a circuit pattern is made not by illumination of the photo-resist through a mask or film negative of the circuit, but rather by directly and selectively exposing the desired areas of the resist or other layer on a substrate with a focused beam of the appropriate energy and dosage to create the desired circuit pattern. However, the DW exposure tool is expensive to own and operate, and exposing an entire wafer is time consuming due to the large amount of data that needs to processed and streamed to the writer. Accordingly, wafer throughput is low as compared to photolithography or other projection imaging systems.

SUMMARY

One of the broader forms of an embodiment of the present invention involves a direct-write (DW) system. The system includes a stage for holding a substrate and operable to scan the substrate; a data processing module for processing pattern data and generating instructions associated with the pattern data; and an exposure module that includes a plurality of beams that are focused onto the substrate and a beam controller that controls the plurality of beams in accordance with the instructions while the substrate is scanned. The data processing module includes a plurality of vertex pair processors each having a plurality of bit inverters. Each vertex pair processor is operable to process a respective vertex pair of an input scan line to generate an output scan line. Each bit inverter is operable to invert a respective input bit of the input scan line to generate a respective output bit of the output scan line if a bit position is located between the respective vertex pair, otherwise the respective input bit is copied to the respective output bit. The instructions correspond to the output bits of the output scan line for each beam.

Another one of the broader forms of an embodiment of the present invention involves a method for direct-writing onto a substrate. The method includes providing a pattern layout that includes a plurality of polygons; slicing the pattern layout into a plurality of stripes, wherein each stripe is associated with a respective beam for writing the stripe onto the substrate and each stripe is partitioned into a plurality of scan lines; determining a plurality of vertex pairs within each scan line, wherein the polygons have edges that are horizontal or vertical, wherein each vertex includes a transition form a horizontal edge to a vertical edge or a transition from a vertical edge to a horizontal edge; and generating a stream of data corresponding to each scan line, wherein the stream of data controls the respective beam that direct-writes onto the substrate while the substrate is scanned. The generation of the stream of data includes processing the vertex pairs by a data processing module. The data processing module includes a plurality of vertex pair processors each having a plurality of bit inverters. Each vertex pair processor is operable to process a respective vertex pair of an input scan line to generate an output scan line, Each bit inverter is operable to invert a respective input bit of the input scan line to generate a respective output bit of the output scan line if a bit position is located between the respective vertex pair, otherwise the respective input bit is copied to the respective output bit. The output bits correspond to the stream of data.

Yet another one of the broader forms of an embodiment of the present invention involves an apparatus for rasterizing pattern data to generate writing instructions for a direct-write system. The apparatus includes M number of vertex pair processors. Each vertex pair processor is operable to process a respective vertex pair of an input scan line to generate an output scan line. Each vertex pair processor includes N number of bit slice inverters and a control portion. Each bit slice inverter is operable to invert a respective input bit of the input scan line to generate a respective output bit of the output scan line if a bit position is located between the respective vertex pair, otherwise the respective input bit is copied to the respective output bit. The control portion that provides a control signal to the plurality of bit slice inverters. The control signal corresponds to a position of the respective vertex pair within each scan line. Each bit slice inverter compares its position with the position of the respective vertex pair to determine whether the bit position is located between the respective vertex pair.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing and more particularly, to a system and method for writing directly to a wafer. It is understood, however, that specific embodiments are provided as examples to teach the broader inventive concept, and one of ordinary skill in the art can easily apply the teaching of the present disclosure to other methods or devices. In addition, it is understood that the methods and system discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1:
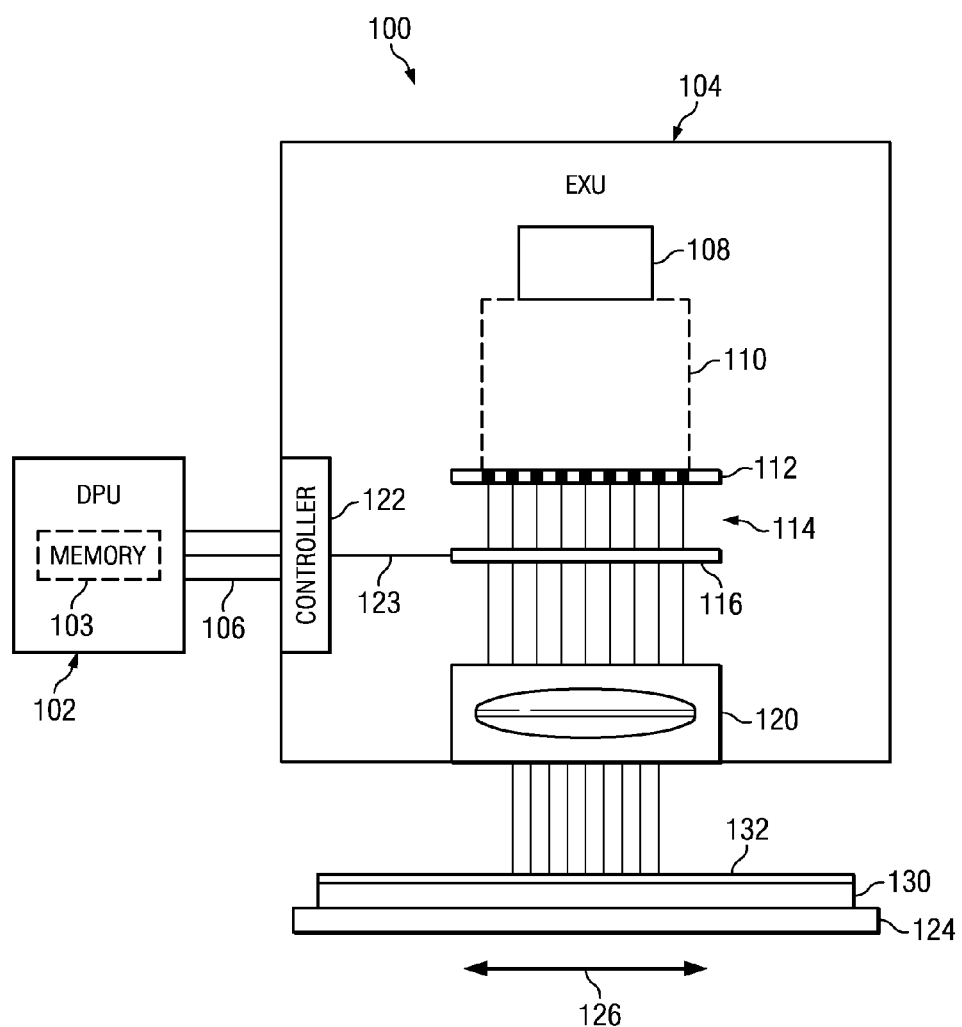
FIG. 1 is a diagrammatic view of an exemplary direct-write (DW) system accordingly to various aspects of the present disclosure.

Referring to FIG. 1, illustrated is a diagrammatic view of an exemplary direct-write (DW) system 100. The DW system 100 includes a data processing unit 102 (DPU) and an exposure unit 104 (EXU). The DPU 102 (DPU) is configured to read patterning data from a data storage medium, which may be within the DPU 102 or remotely positioned and in communication with the DPU 102. The DPU 102 obtains the patterning data and loads it into its memory 103. The DPU 102 includes a pattern generator that processes the patterning data and generates a pattern writing instruction set as will be explained in greater detail below. The DPU 102 sends the writing instruction set to the EXU 104. Additionally, the DPU 102 may also perform proximity correction and transformation to the writing instruction for the EXU 104. Alternatively, the proximity correction and transformation may optionally be performed separately by a standalone module. The writing instruction set are preferably sent on one or more optical fibers 106 using light radiation as carriers of the information as will be discussed later herein.

The EXU 104 includes a source 108 that is configured to generate at least one energized beam 110, such as a photon beam, electron beam, or ion beam. The beam 110 may pass through one or more lenses (not shown) and may be focused to a beam aperture portion 112. The beam aperture portion 112 is configured with a plurality of apertures or openings that split the beam 110 into a plurality of beams 114. The number of beams 114 may vary depending on the design requirements of the DW system 100 as will be discussed later herein. The plurality of beams 114 may travel to a beam controller 116 that is configured to allow one or more of the beams to pass through to an imaging head 120, or to block/blank one or more of the beams 114 from passing through to the imaging head. The imaging head 120 includes an electron optical system for focusing the beams that are allowed to pass through. The beam controller 116 may include a plurality of deflectors (also referred to as blankers) that are controlled by electrical control signals that are associated with the writing instructions sent from the DPU 102. When the deflector is not energized, the corresponding beam is allowed to pass through to the imaging head 120. When the deflector is energized, an electrical field is generated that deflects the corresponding beam such that the beam is blocked from passing through to the imaging head 120.

The EXU 104 may further include a controller 122 that receives the writing instructions from the DPU 102 via the optical fibers 106. The writing instructions are sent using light radiation as carriers of the information. Accordingly, the controller 122 includes a plurality of light-to-electrical converters, such as photodiodes, that convert the light signals (e.g., writing instructions) into electrical control signals which are used to control 123 the deflectors of the beam controller 116 as discussed above. The DW system 100 further includes a stage 124 that is configured to move 126 in various directions. The stage 124 may hold and secure a wafer 130 by a vacuum system or other suitable securing mechanism. The wafer 130 may include a semiconductor substrate, a mask blank, a glass substrate, and a flat panel substrate. The wafer 130 includes a recording medium 132, such as a photoresist, formed thereon. During processing, the wafer 130 is moved or scanned relative to the imaging head 120 and in cooperation with the controller 122. The beams 114 that pass through to the imaging head 120 are focused, by the electron optical system, onto the recording medium 132 such that the desired pattern is written directly into the recording medium (without a photomask or reticle). After the entire wafer 130 has been scanned, the recording medium 132 is developed to form the pattern over the wafer 130, and other processing, such as etching and doping, may be performed using the patterned recording medium. It is understood that the DW system 100 may include other components such as an alignment system and collimator, but is simplified for a better understanding of the disclosed embodiments herein.

Figure 2:
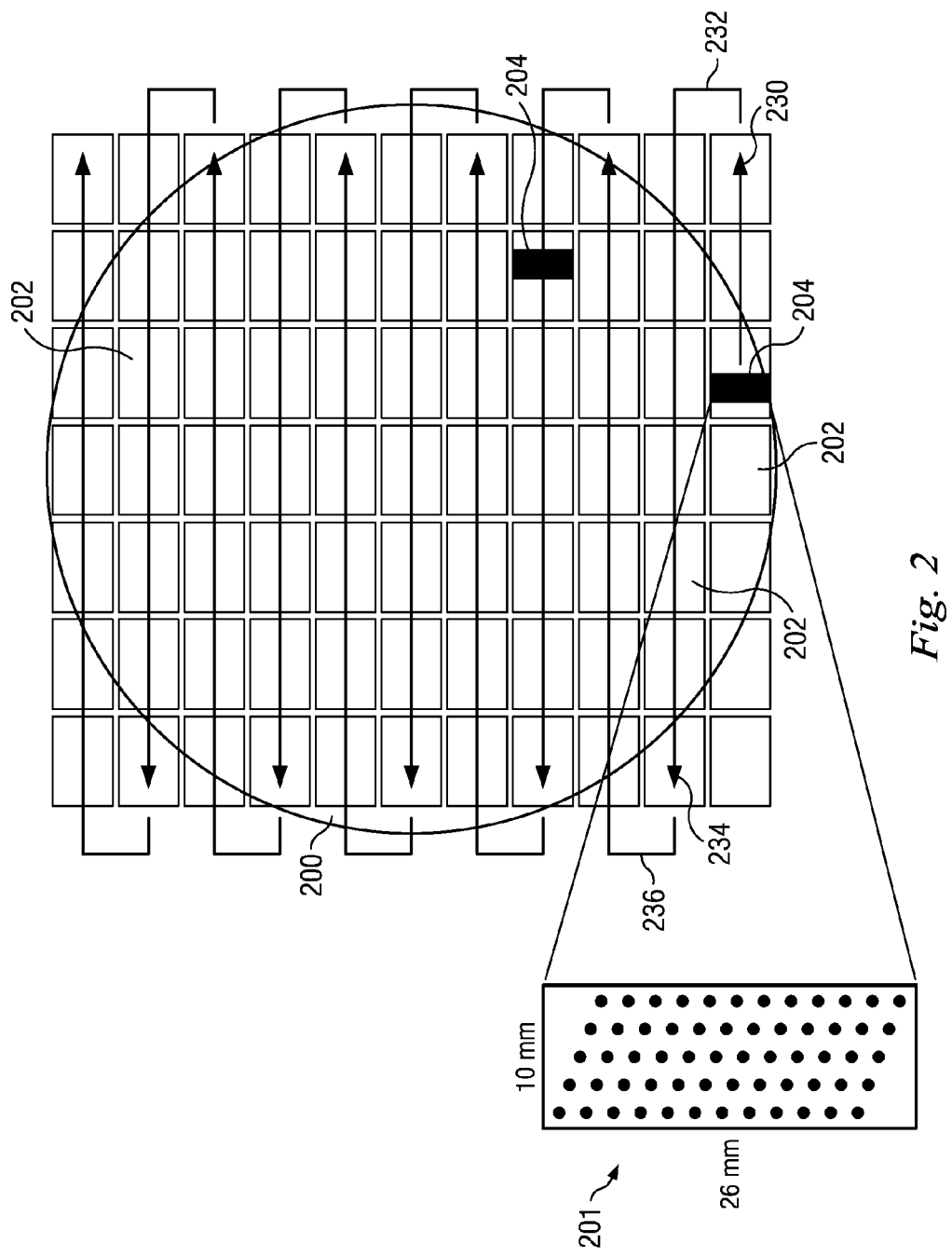
FIG. 2 is a top view of a substrate being scanned by a DW system having a plurality of beams according to various aspects of the present embodiment.

Referring to FIG. 2, illustrated is a top view of a wafer 200 being scanned with a DW system having a plurality of beams 201. In semiconductor fabrication, the wafer 200 may include a 300 mm wafer. The wafer 200 may be divided into a plurality of fields 202. Each field 202 may include a field size of 26 mm by 33 mm. The field 202 may include at least one die that is repeated over the entire wafer 200. It is preferred to assemble as many chips (e.g., independently functioning circuits) into the die to minimize the steps required to expose the entire wafer, and thus maximize the wafer throughput. The plurality of beams 201 may include 13,000 beams that may be arranged in an array that is confined within an exposure area 204 (also referred to as an electron optical (EO) slit) of 26 mm by 10 mm. Each beam may write a 2 μm stripe of up to 33 mm. Accordingly, the exposure area 204 may be sufficient to directly write the field 202 of 26 mm by 33 mm as the wafer 200 is scanned in one direction.

As discussed above, the wafer 200 may be secured to a stage (not shown) that is similar to the stage 124 of FIG. 1. The stage is configured to move in an x-direction and a y-direction so that the entire wafer 200 can be scanned and directly written to by the plurality of beams 201. For example, the wafer 200 (via the stage) is moved in a direction 230 along the x-direction, and the writing instructions (e.g., turning on/off each beam) control the plurality of beams 201 to write the desired pattern on the field 202. The beams 201 may be scanned in the opposite direction relative to the wafer 200 during the writing. The writing instructions are repeated as the exposure area 204 moves to the next field 202 and so forth. When the exposure area 204 approaches an edge of the wafer 200, the stage continues to move such that the exposure area 204 goes beyond the wafer edge at a sufficient distance to facilitate a change in direction 232. The wafer 200 is then moved in an opposite direction 234 along the x-direction during exposure until the exposure area 204 again reaches the wafer edge. The DW system repeats this process to write the desired pattern for each field 202 on the wafer 200.

Figure 3:
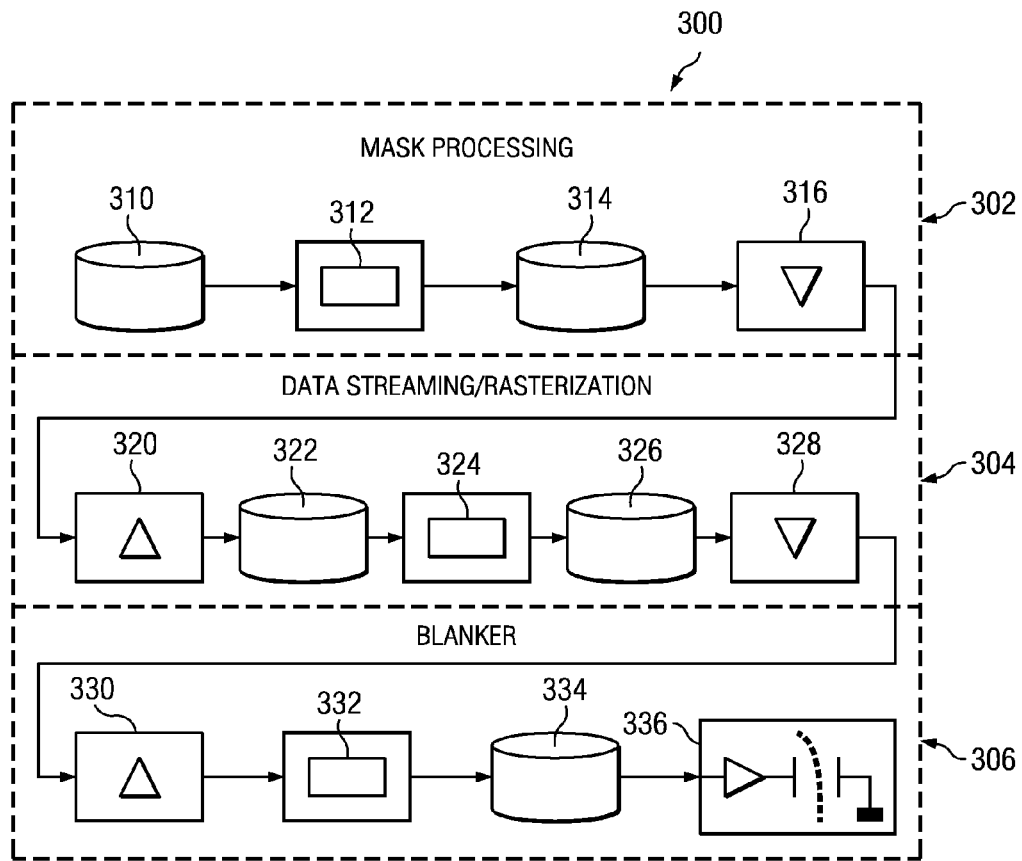
FIG. 3 is a block diagram of an exemplary data flow path that can be implemented in the DW system of FIG. 1.

Referring to FIG. 3, illustrated is a block diagram of an exemplary data flow path 300 that can be implemented in the DW system of FIG. 1. The data flow 300 may be divided into three stages including a mask processing stage 302, a data streaming/rasterization stage 304, and a blanker stage 306. The mask processing stage 302 prepares design data of a mask file for writing on the DW system. The mask processing stage 302 includes a mask server 310, a processing module 312, a pre-processed and DPU formatted data server 314, and a transmitter 316. The mask server 310 stores the design data of the mask file, such as GDS file or OASIS file, to be processed. The processing module 312 performs processing and calculations of process corrections that are applied on the mask in order to reproduce the designed image accurately on the wafer. For example, the processing module 312 may perform GDS/OASIS parsing, proximity correction, data slicing, rasterizer formatting, dithering, decompression, and other suitable processing. The pre-processed and DPU formatted data server 314 stores the mask data (e.g., design or mask layout) suitable for writing on the DW system. The transmitter 316 may include an Ethernet transmitter for transferring the pre-processed design data to the data streaming/rasterization stage 304.

The data streaming/rasterization stage 304 sends the pre-processed mask data for actual writing by the machine. The mask data is rasterized and low-level corrections are applied to the data before it is streamed to the DW system. The data streaming/rasterization stage 304 includes a receiver 320, a vertex buffer 322, a rasterizer module 324, a scan line buffer 326, and a transmitter 328. The receiver 320 may include an Ethernet receiver for receiving the pre-processed design data from the transmitter 316 of the mask processing stage 302. The mask data is typically provided in a vector based format that specifies vertices and/or edges of polygons that make up the image of the mask. All mask polygons are either horizontal or vertical so that at each vertex there is a transition from a horizontal to a vertical edge, or from a vertical to a horizontal edge. The vertices of the mask data are stored in the vertex buffer 322. The mask data in the vertex buffer 322 is provided to the rasterizer module 324 to convert the mask data into a stream of bits (bitmap). The bitmap image of the mask data includes a black and white image of the pattern to be written. The rasterizer module 324 includes processing such as rasterization, dithering, decompressing, and other suitable processing as will be explained in detail below. The rasterizer module 324 provides the stream of bits (or streaming data) to the scan line buffer 326. The transmitter 328 may include optical links such as optical fibers for transferring the streaming data (e.g., writing instructions) to the blanker stage 306. It should be noted that the rasterization takes place in the data streaming stage 304 instead of the pre-processing stage 302, and thus this reduces the amount of buffer memory usage.

The blanker stage 306 receives the streaming data to modulate an electron beam control signal to write onto a wafer. The blanker stage 306 includes a receiver 330, a processing module 332, a bit buffer 334, and a blanker 336. The receiver 330 may include an optical receiver, such as a photodiode, for receiving the streaming data from the transmitter 328 via optical links. The receiver 330 may convert light signals into electrical control signals that are provided to the processing module. The processing module 332 receives the electrical control signals and provides signal conditioning such as synchronization. The control signals are stored in the bit buffer 334. The control signals control the blanker 336 associated with a corresponding beam to write onto the wafer. For example, when the blanker 336 is not energized, the corresponding beam is allowed to pass through to the imaging head. When the banker 336 is energized, an electrical field is generated that deflects the corresponding beam such that the beam is blocked from passing through to the imaging head. It is understood that the number of receivers and blankers depends on the number of beams in the DW system.

Figure 4:
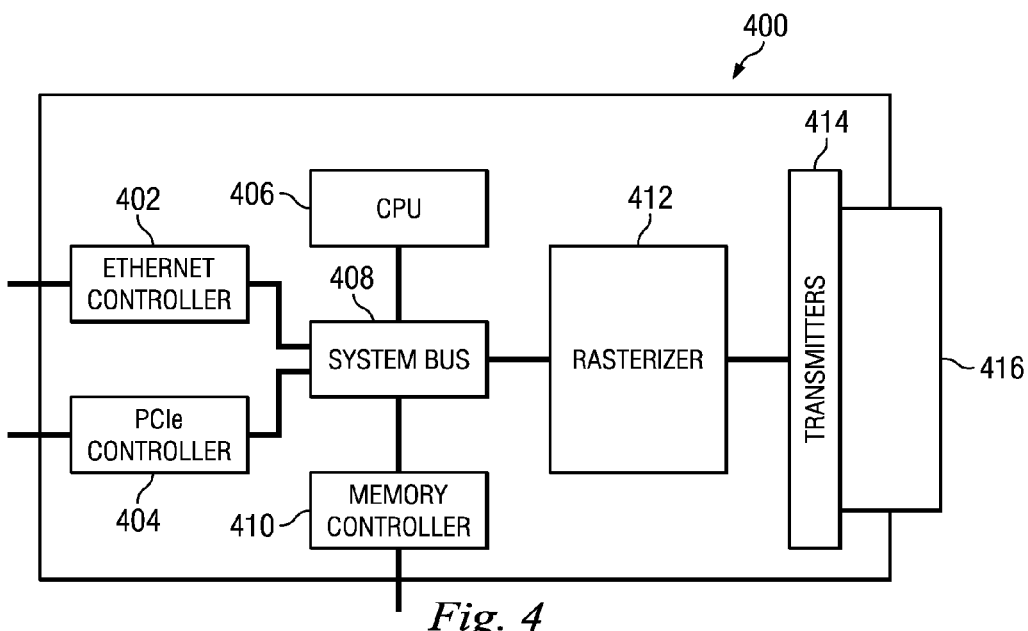
FIG. 4 is a block diagram of an exemplary rasterizer system according to various aspects of the present disclosure.

Referring to FIG. 4, illustrated is a block diagram of an exemplary rasterizer system 400 according to an embodiment of the present disclosure. The rasterizer system 400 may be implemented in a data processing unit (such as the one 102 shown in FIG. 1) to stream writing data to an exposure unit (such as the one 104 shown in FIG. 1) in real-time. The rasterizer system 400 may control a plurality of channels, and thus it is understood that the number of rasterizer systems may depend on the number of beams that are controlled in the exposure unit. The rasterizer system 400 includes an Ethernet controller 402, a PCI Express (PCIe) controller 404, a central processing unit (CPU) 406, a system bus 408, a memory controller 410, a rasterizer 412, transmitters 414, and optical links 416. The Ethernet controller 402, the PCIe controller 404, the CPU 406, the memory controller 410, and the rasterizer 412 may be coupled to the system bus 408 by direct component connection.

The Ethernet controller 402 is coupled to a mask processing module (not shown) and/or data processing unit (not shown) via an Ethernet connection. The PCIe controller 404 may be coupled to an expansion slot for interfacing with the mask processing module and/or the data processing unit via a PCIe connection. Accordingly, the Ethernet controller 402 and/or the PCIe controller 404 can be used to receive mask data and/or process and control instructions such as processing signals, diagnostic data, synchronization, etc. The CPU 406 may run an operating system and/or application program that is used to coordinate and provide control to the various components of the rasterizer system 400. The memory controller 408 may be coupled to memory (not shown) that stores the mask data. In an embodiment, the mask data may be in a compressed format to efficiently store the data. Accordingly, the mask data may be decompressed before being streamed to the rasterizer 412. The rasterizer 412 includes circuitry for converting the mask data into a stream of bits that are sent to the transmitters 414. The transmitters 414 are coupled to a beam controller (not shown) via the optical links 416.

Figure 5:
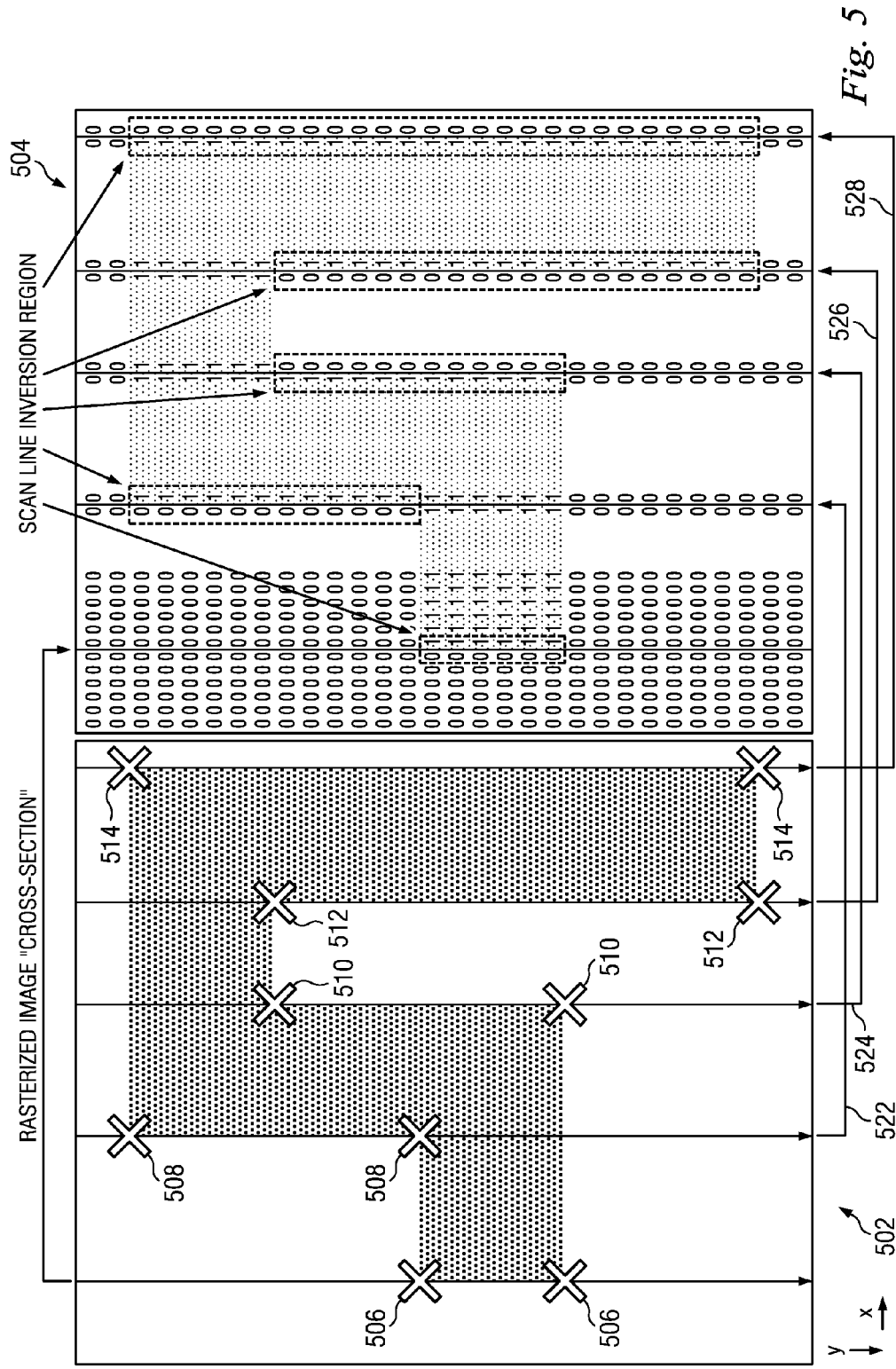
FIG. 5 is a diagrammatic representation of an exemplary process for rasterizing mask data according to various aspects of the present disclosure.

Referring to FIG. 5, illustrated is a diagrammatic representation of an exemplary process for rasterizing mask data according to various aspects of the present disclosure. The mask data is described using a vector based format such as GDS. The vector based format specifies the vertices and/or edges of polygons that make up a mask pattern. The mask data is converted to a raster image which corresponds to a two dimensional matrix. The mask pattern may be referenced using an x-direction and y-direction. An assumption is made with respect to the mask polygons that are converted. The assumption is that all mask polygon edges are either horizontal or vertical so that at each vertex there is a transition from a horizontal to a vertical edge, or from a vertical to horizontal edge. Using this assumption, a conversion scheme from polygon to the raster image can be determined. The conversion scheme specifies that each vertex pair denotes a region of image inversion. Accordingly, the raster image is built up by scanning along vertical scan-lines (y-direction) and bit-wise inverting the image from one scan line to the next scan line in the regions between vertex pairs. The scan line corresponds to a scan of beams to direct write onto a wafer as will be explained in detail below.

The conversion scheme is illustrated with respect to a mask pattern 502 being converted into a raster image 504. It is understood that the mask pattern 502 may include any number of polygons with various shapes but is simplified for the sake of discussion herein. Additionally, the number of scan lines and bits per scan line illustrated herein only serve as examples to show the rasterization process, and are not intended to limit the rasterization process to a particular number of scan lines or bits per scan line. The mask pattern 502 includes a polygon having vertex pairs 506, 508, 510, 512, and 514. As noted above, at each vertex, there is a transition from a horizontal to vertical edge, or from a vertical to horizontal edge. For example, the vertex pair 506 includes vertices with a transition from a vertical to a horizontal edge. The vertex pairs 508, 510, 512 each includes one vertex with a transition from a vertical to a horizontal edge and another vertex with a transition from a horizontal to vertical edge. The vertex pair 514 includes vertices with a transition from a horizontal to a vertical edge.

The raster image 504 is formed by scanning from top to bottom (y-direction) corresponding to a scan line, and moving to a next scan line (x-direction) to repeat the rasterizing process. An initial scan line is all zeros "0." The next scan line is equal to the previous scan line, except for the regions between vertex pairs which are bit-wise inverted. Accordingly, the initial six scan lines of the raster image 504 are all zeros "0" since there are no vertex pairs. That is, scan lines that do not include any vertex pairs are just a copy of the respective previous scan line. A next scan line (seventh scan line) is equal to the previous scan line (sixth scan line) except for a region (shown by the dotted line) between vertex pair 506 which is bit-wise inverted. As such, the region between vertex pair 506 is bit-wise inverted from zero "0" to one "1" in the seventh scan line. The region between vertex pair 506 includes 6 bits that are inverted from zero "0" to one "1." The conversion continues with a next scan line (eighth scan line) which is a copy of the previous scan line (seventh scan line), and so forth until a scan line that includes vertex pair 508 is reached.

It should be noted that the raster image 504 shows scan lines that have inversion regions corresponding to vertex pairs 508, 510, 512, 514 for the sake of clarity. The scan lines that are not shown have no vertex pairs, and thus these scan lines are not modified. These scan lines (not shown) are essentially a copy or duplicate of the respective previous scan line. It is noted that these scan lines need not be physically copied in memory, but can be read out multiple times. The number of times the line is read out can be determined from the y-position information from the next scan line. In a scan line 522 that includes the vertex pair 508, the scan line 522 is a copy of the previous scan line except for a region between vertex pair 508 which is bit-wise inverted. As such, 12 bits in the region between vertex pair 508 are inverted from zero "0" to "1." The next scan lines are a copy of scan line 522 until a scan line 524 that includes the vertex pair 510 is reached. The scan line 524 is a copy of the previous scan line except for a region between vertex pair 510 which is bit-wise inverted. As such, 12 bits in the region between vertex pair 510 are inverted from one "1" to zero "0." The next scan lines are a copy of scan line 524 until a scan line 526 that includes the vertex pair 512 is reached. The scan line 526 is a copy of the previous scan line except for a region between vertex pair 512 which is bit-wise inverted. As such, 20 bits in the region between vertex pair 512 are inverted from zero "0" to one "1."

The next scan lines are a copy of scan line 526 until a scan line 528 that includes the vertex pair 514 is reached. The scan line 528 is a copy of the previous scan line except for a region between vertex pair 514 which is bit-wise inverted. As such, 26 bits in the region between vertex pair 514 are inverted from one "0" to zero "1." The process ends when a last scan line of the raster image 504 is generated from the mask pattern 502. The raster image 504 may be referred to as a bitmap image. The bitmap image depicts a two-dimensional matrix that is divided into a plurality of pixels with each pixel having a zero "0" or one "1" to indicate whether the pixel is written to or not. For example, each beam may be configured to write a 2 μm stripe (y-direction) up to 33 mm in length (x-direction). As such, each pixel of the stripe is approximately 2.25 nm×2.25 nm. It is noted that the number of scan lines and number of bits per scan line may vary depending on requirements of a particular application and limitations of the DW system. It has been observed that a speed of the rasterization algorithm discussed above depends on a complexity of the mask pattern (i.e. vertex density). The time to convert a mask pattern to a rasterizer image can be decreased. Accordingly, the rasterization algorithm can be run in parallel using simple computational elements, such as logic elements, which makes it scalable and suitable for high-speed processing as will be explained in detail below.

Figure 6:
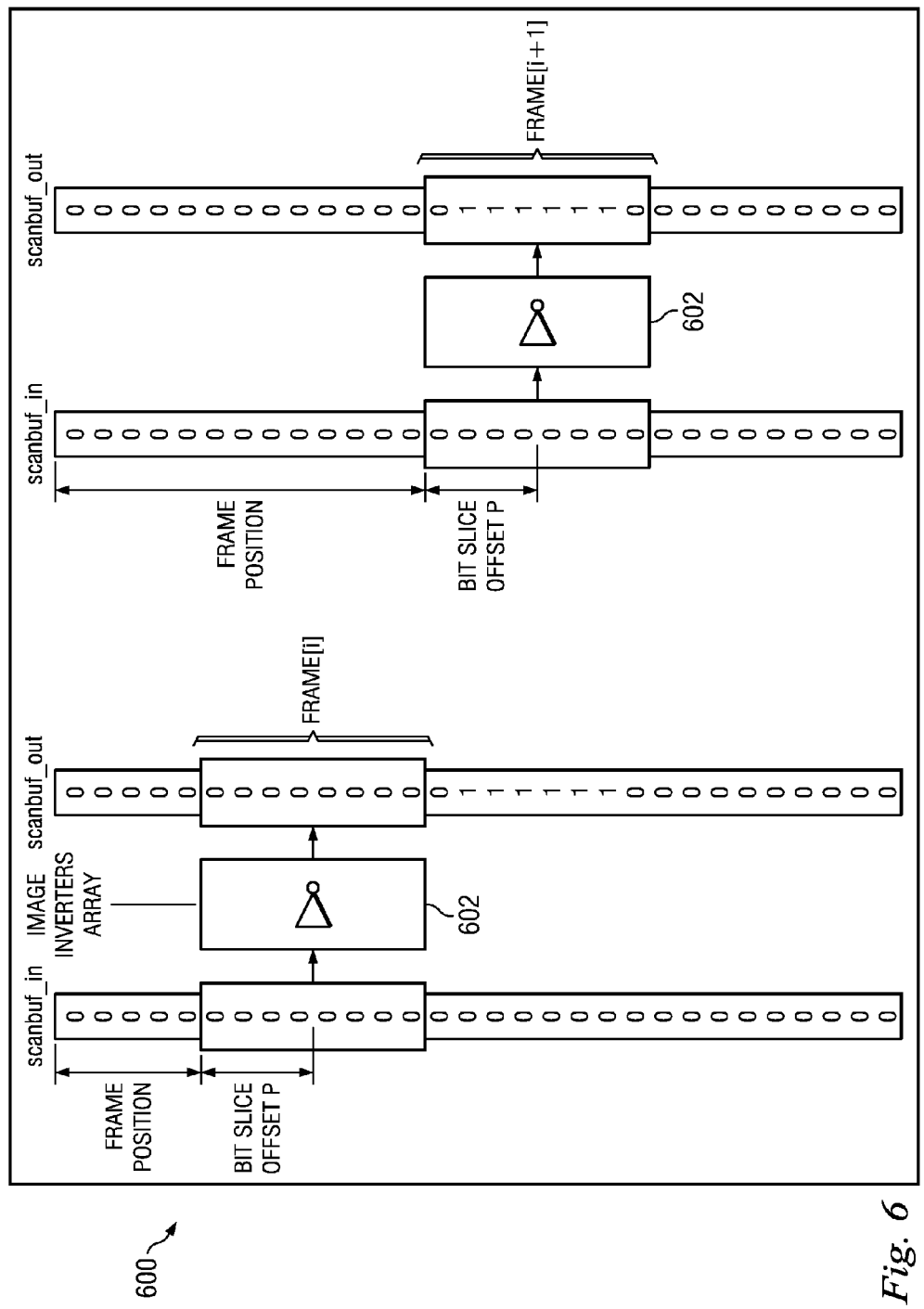
FIG. 6 is a diagrammatic representation of an exemplary hardware implementation that may be used to perform the rasterization process of FIG. 5.

Referring to FIG. 6, illustrated is a diagrammatic representation of a hardware implementation 600 that may be used to perform the rasterization process discussed in FIG. 5. The hardware implementation 600 utilizes an image inverter array 602 for processing a scan line. The image inverter array 602 includes a parallel block of inverters (i.e. N number of bit inverter slices). The parallel block of inverters may process the scan line in frames of "N" at a time. Thus, this allows parallelization in rasterizer width which corresponds to parallel conversion of individual bits. In the present example, the sixth and seventh scan lines of the raster image 504 shown in FIG. 5 are being processed. As noted above in FIG. 5, the seventh scan line is equal to the sixth scan line except for the region between vertex pair 506 which is bit-wise inverted. An input bit, scanbuf_in, corresponds to a bit of a input/previous scan line (i.e. the sixth scan line). An output bit, scanbuf_out, corresponds to a bit of a output/next scan line (i.e. the seventh scan line). In frame [i], all the input bits are copied since the image bits are not within the region between vertex pair 506, and thus the output bits are the same value ("0") as the input bits. In frame [i+1], some input bits are inverted (i.e. inverted from zero "0" to one "1") since the image bits are within the region between vertex pair 506, and thus the corresponding output bits have the inverted value. It is understood that a frame size may include various number of bits depending on design specification. Each bit inverter in the image inverter array 602 includes control logic that can determine whether it is located within the vertex pair 506 and accordingly inverts the image bit or copies it as explained below in FIG. 7.

Figure 7:
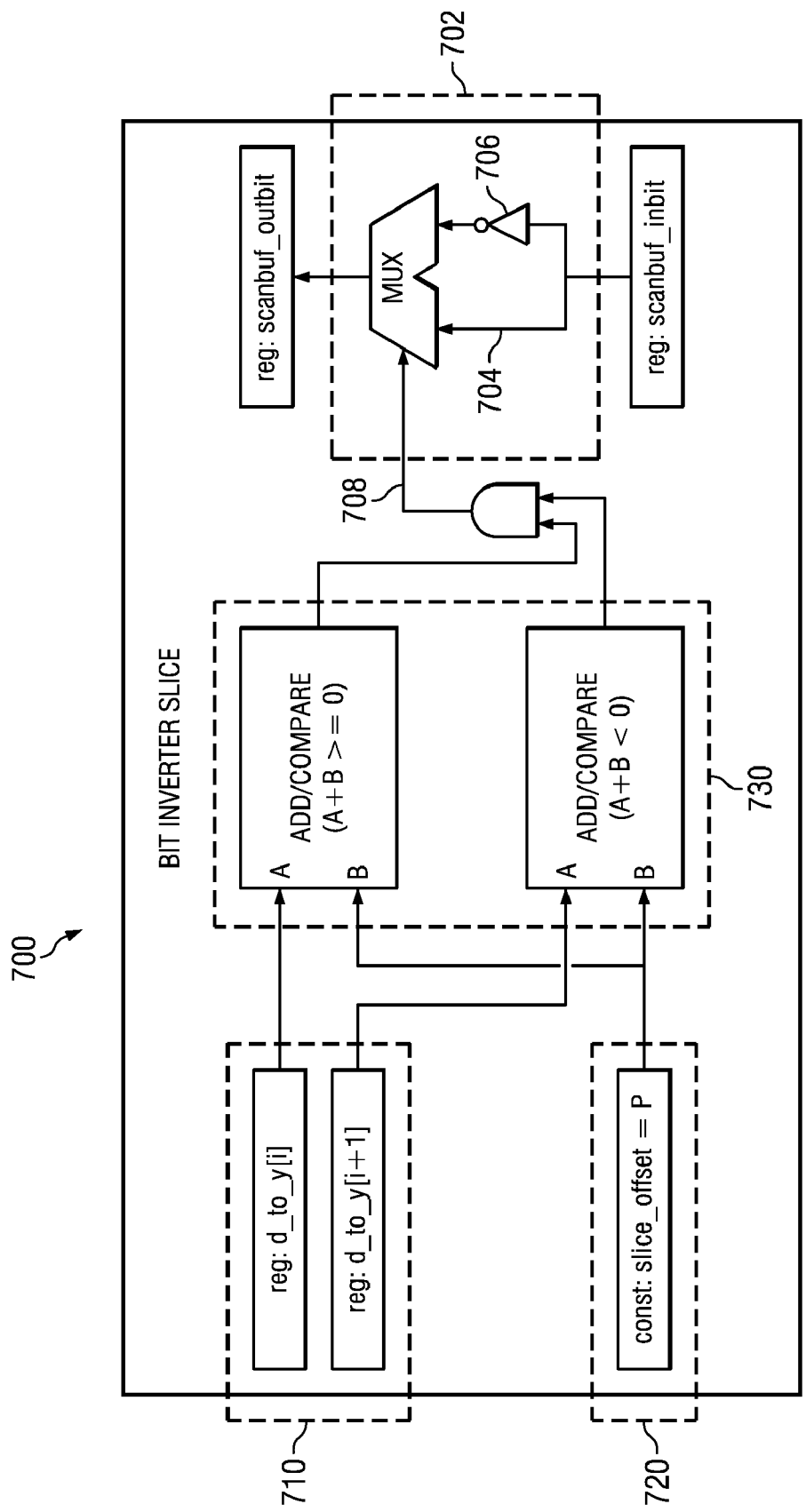
FIG. 7 is a schematic diagram of a bit inverter slice module that can implemented in the hardware implementation of FIG. 6.
Figure 8:
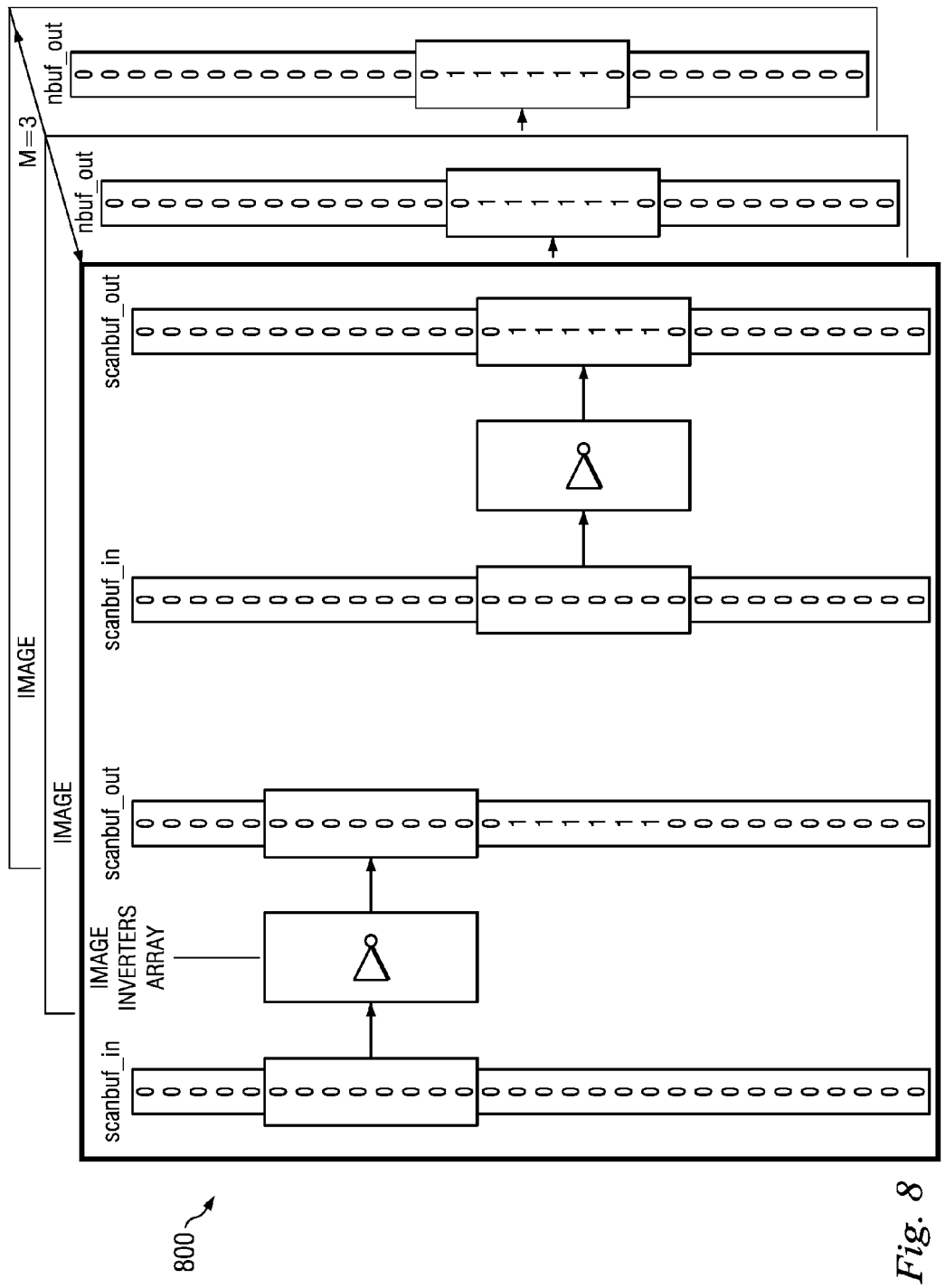
FIG. 8 is a diagrammatic representation of an exemplary hardware implementation that enables parallel processing of vertex pairs according to various aspects of the present disclosure.

Referring also to FIG. 7, illustrated is schematic diagram of a bit inverter slice module 700 that can implemented in the image inverter array 602 of FIG. 6. The bit inverter slice module 700 is an exemplary hardware implementation of a single bit inverter. The bit inverter slice module 700 includes a image inverter portion 702 for copying 704 or inverting 706 an input bit, scanbuf_inbit, and sending it to an output bit, scanbuf_outbit, depending on a multiplexer control signal 708. A vertex pair position 710 (relative to a frame position), d_to_y[i] and d_to_y[i+1], and bit slice position 720, slice_offset P, are inputted to a position comparator portion 730 to determine whether an image bit is located between vertices y[i] and y[i+1]. The comparator portion 730 provides outputs to an AND gate. If the image bit is between the vertex pair y[i] and y[i+1], both outputs of the position comparator 730 are true which results in the multiplexer sending the inverted bit to the output bit, scanbuf_outbit. Otherwise, the copied/original bit is sent to the output bit, scanbuf_outbit. It should be noted that processing involves a simple bit inversion, and thus can be executed at extremely high speed Referring also to FIG. 8, illustrated is a diagrammatic representation of a hardware implementation 800 that enables parallel processing of vertex pairs according to an embodiment of the present disclosure. As discussed above, the region between a vertex pair is bit-wise inverted by the image inverter array 602 (FIG. 6). However, a scan line typically includes a large number of vertex pairs, and thus all vertex pairs of the scan line are processed by the image inverter array 602 (FIG. 6) one vertex pair at a time. Accordingly, a vertex load loop dominates processing time which results in delay for high vertex density patterns. The hardware implementation 800 utilizes M vertex pair processors (VPP) 802 that each utilize the image inverter array 602 and compare position with its own vertex pair at a time. Thus, this allows parallelization in rasterizer depth which corresponds to parallel processing of vertex pairs. Although three vertex pair processors 802 (M=3) are shown in the present example, it is understood that the number of vertex pair processors may vary depending on design specification.

Figure 9A:
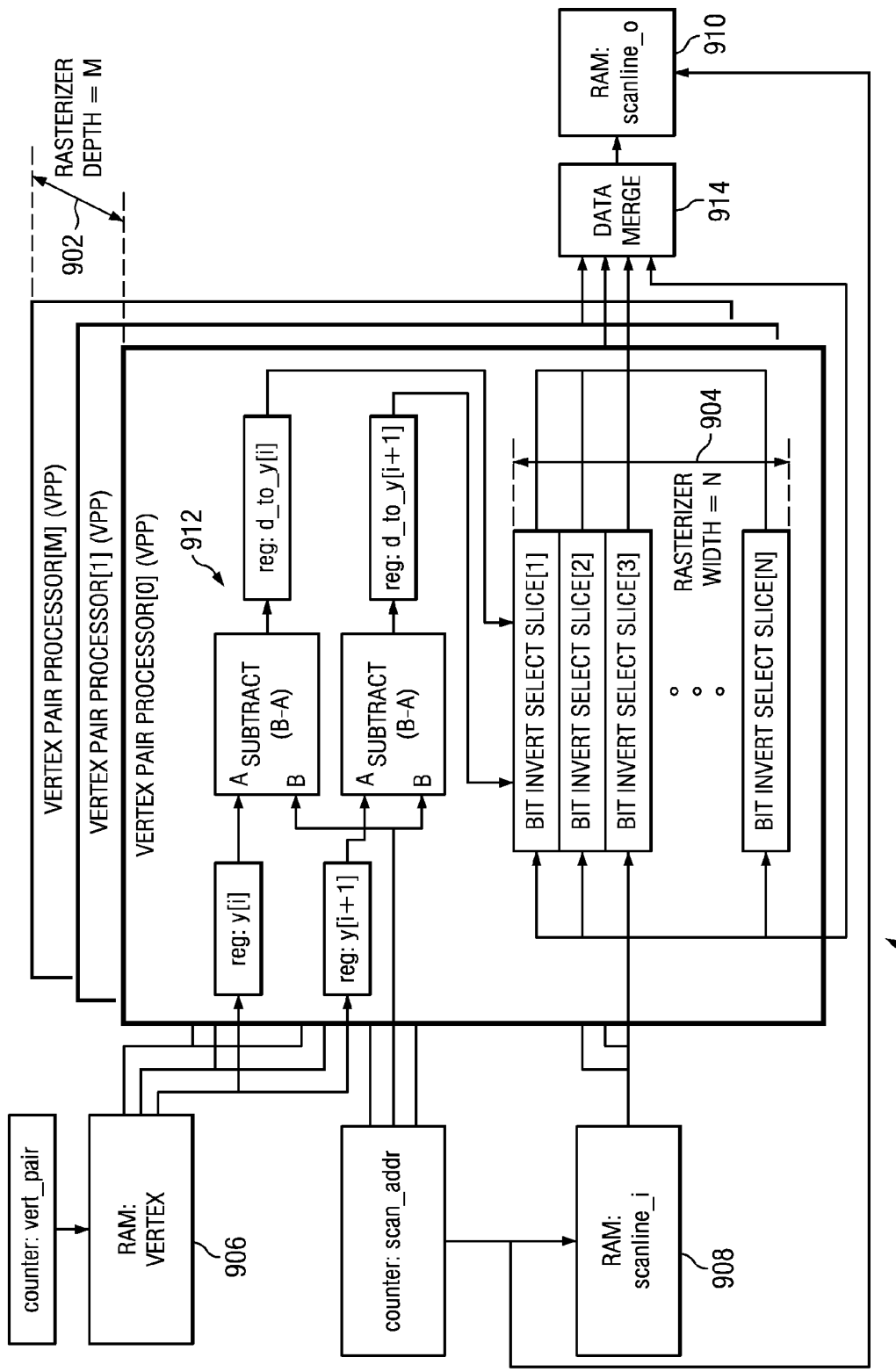
FIG. 9A is a schematic diagram of a rasterizer module that implements parallel processing of mask data according to various aspects of the present disclosure.
Figure 9B:
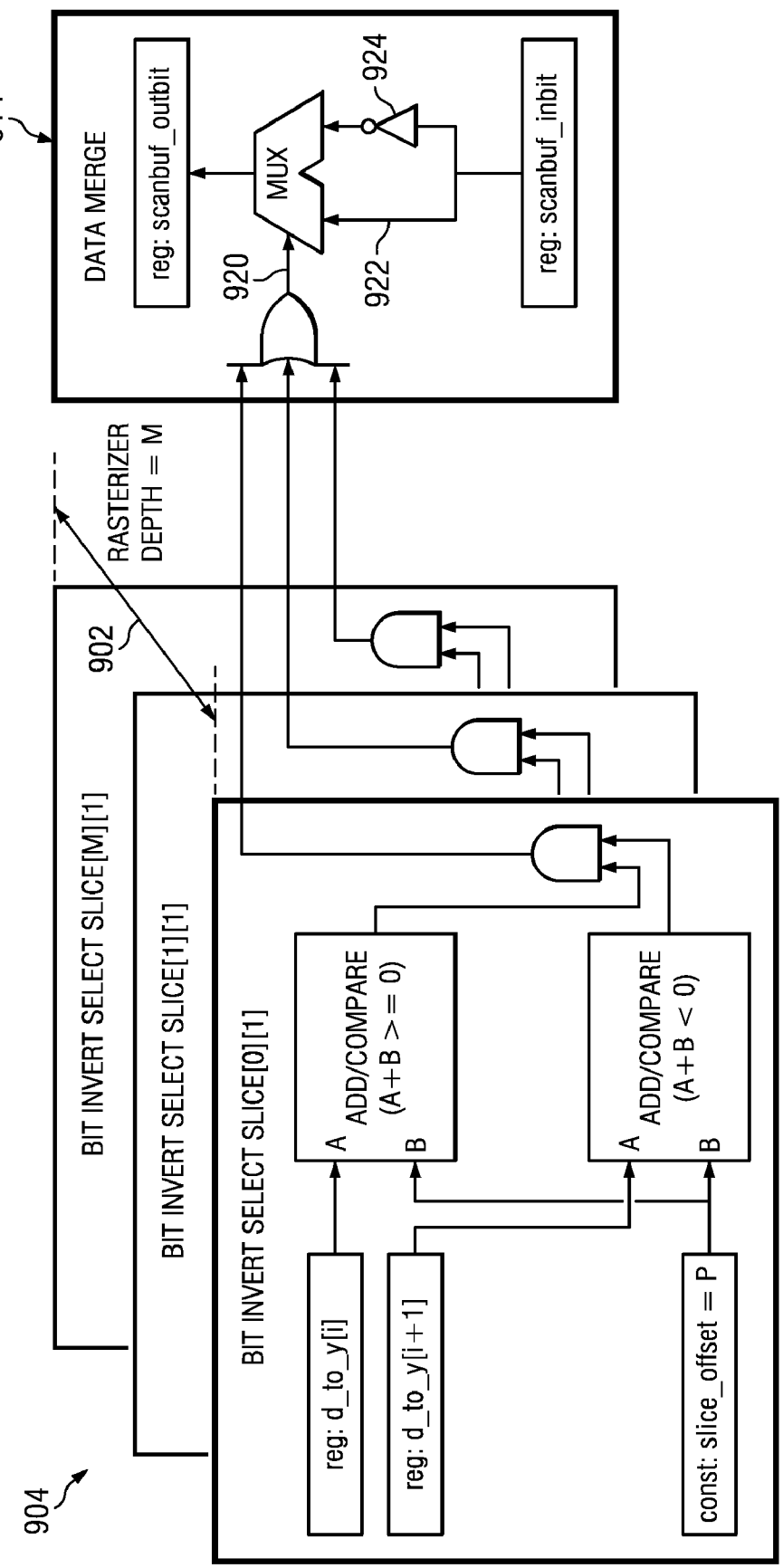
FIG. 9B is a schematic diagram of a data merger module that can be used in the rasterizer module of FIG. 9B according to various aspects of the present disclosure.

Referring to FIGS. 9A and 9B, illustrated are a block diagram of a rasterizer module 900 that implements parallel processing of mask data according to an embodiment of the present disclosure, and a block diagram of a data merger module 914 that is implemented in the rasterizer module 900 according to an embodiment of the present disclosure, respectively. As discussed above, a mask pattern is converted to a bitmap image using a rasterization algorithm. The mask pattern is stored in a vertex format (see FIG. 12) defined for rasterization as will be explained in detail below. In order to achieve real-time conversion, parallel processing of the mask pattern may be implemented with respect to rasterizer width and rasterizer depth. This allows for generating the writer pattern at extremely high speed with reduced memory usage. In other words, rasterization of the mask pattern can be performed on-line and does not require a large buffer memory to store to the bitmap image. In FIG. 9A, the rasterizer module 900 implements M number of vertex pair processors (VPP) 902 (similar to the one 800 in FIG. 8) with each VPP having N number of bit invert select slices 904 (similar to the one 700 shown in FIG. 7). The M number of VPPs 902 are denoted as Vertex Pair Processor[0], Vertex Pair Processor[1] . . . . Vertex Pair Processor[M]. The N number of bit invert select slices 904 are denoted as Bit Invert Select Slice[1], Bit Invert Select Slice[2], Bit Invert Select Slice[3] . . . Bit Invert Select Slice [N]. The rasterizer module 900 includes memory 906 for storing vertex pairs (vertex), memory 908 for storing a scan line input (scanline_i), and memory 910 for storing a scan line output (scanline_o). The memory 906, 908, 910 may be implemented as random access memory (RAM).

Control signals are generated from a vertex pair. Accordingly, each VPP 902 includes a control portion 912 that receives the vertex pair stored in the memory 908 and a scan address counter to generate a control signal regarding a vertex pair position, d_to_y[i] and d_to_y[i+1], relative to a frame position. As discussed above with reference to FIG. 7, the scan line bits (scanline_i) are processed by the bit invert select slices 904. The scan line bits that lie between the vertex pair are inverted and the scan line bits that do not lie between the vertex pair are copied. When the vertex pair is passed, the control portion 912 loads a next vertex pair and continues processing of the scan line. This process is parallelized by having M number of VPPs 902 so that each VPP can process a vertex pair at a time. The output data that is generated from the bit invert select slices 904 of each VPP 902 are merged by a data merger module 914 as will be explained in greater detail below and stored in the output scan line memory 910. The critical path of the data runs through simple inverts so that delay can be minimized to generate a high speed circuit of the rasterizer module 900. The data flow within the rasterizer module 900 is also linear which makes pipelining available for increasing the operating frequency of the rasterizer module.

In FIG. 9B, as discussed above, each VPP 902 includes N number of bit invert select slices 904. It is noted that only the merger of the first position bit invert select slice (Bit Invert Select Slice[1]) of each VPP 902 is illustrated for the sake of clarity and simplicity. As discussed above, a vertex pair position (relative to a frame position), d_to_y[i] and d_to_y[i+1], and bit slice position, slice_offset P, are inputted to a position comparator portion to determine whether an image bit (corresponding to Bit Invert Select Slice[1]) is located between vertices y[i] and y[i+1]. The comparator portion provides outputs to an AND gate. This comparison is performed for the Bit Invert Select Slice[1] in each VPP 902 denoted as Bit Invert Select Slice[0][1], Bit Invert Select Slice[1][1] . . . . Bit Invert Select Slice[M][1]. The output of the AND gate for each VPP 902 is provided to an OR gate in the data merger module 914. The output of the OR gate provides a multiplex control signal 920. The data merger module 914 includes a portion for copying 922 or inverting 924 an input bit, scanbuf_inbit, and sending it to an output bit, scanbuf_outbit, depending on a multiplexer control signal 920. Accordingly, if any of the outputs (corresponding to the Bit Invert Select Slice[1]) of the VPPs 902 are true, the multiplexer sends the inverted bit to the output bit, scanbuf_outbit. Otherwise, the copied/original bit is sent to the output bit, scanbuf_outbit. It is understood that the data of the other bit invert select slices (Bit Invert Select Slice[2] . . . . Bit Invert Select Slice[N]) for each VPP 902 are merged in a similar manner.

Figure 10:
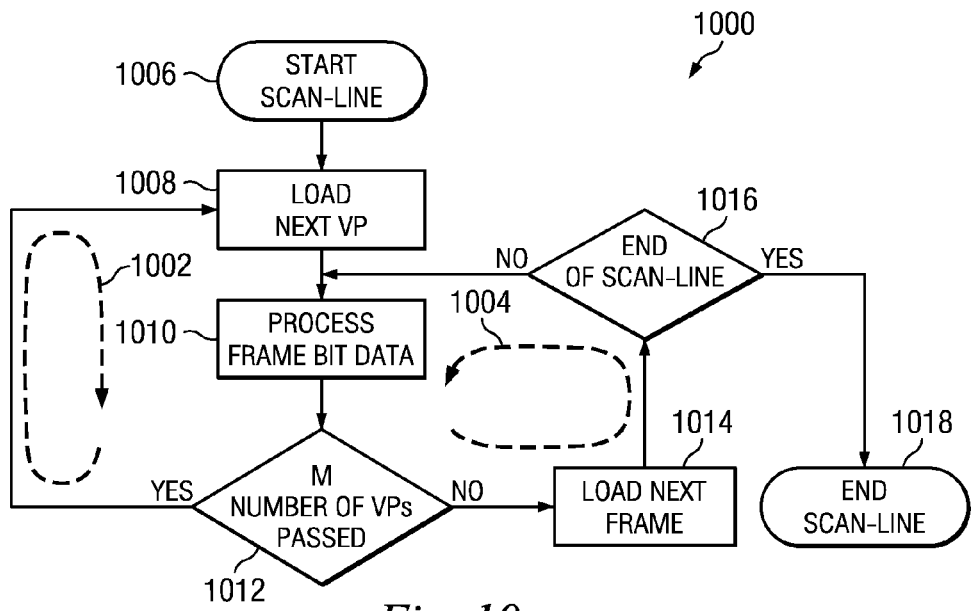
FIG. 10 is a flowchart of an exemplary method 1000 for converting mask data to bitmap data according to various aspects of the present disclosure.

Referring to FIG. 10, illustrated is a flowchart of an exemplary method 1000 for converting mask data to bitmap data according to an embodiment of the present disclosure. The method 1000 may be implemented in a computer-readable medium for executing by a processor (such as the CPU 406 shown in FIG. 4) to control processing of the rasterizer module 900 of FIG. 9. The method 1000 includes a vertex load loop 1002 and a frame process loop 1004. The vertex load loop 1002 loads a vertex pair of a scan line. The frame process loop 1004 processes bit data of a frame. The method 1000 begins at step 1006 in which processing of a scan line is started. The method 1000 continues at step 1008 in which a vertex pair (VP) is loaded. The scan line may include one or more vertex pairs. Accordingly, a first vertex pair of the scan line is loaded. The method 1000 continues at step 1010 in which bit data of a current frame is processed. The bits of the current frame within a region between the vertex pair are inverted, otherwise the bits are copied. The number of bits of the current frame may vary depending on the rasterizer width (e.g., N number of bit inverter slices) The bit data of a frame may include a number of bits The method 1000 continues at step 1012 in which a determination is made as to whether M number of vertex pairs have been passed. As discussed above, the rasterization module 900 (of FIG. 9) includes M number of vertex pair processors (VPP). Accordingly, the vertex load loop 1002 is entered only after all of the M vertex pairs are passed thereby increasing effective throughput. If the determination at step 1012 is yes, the method 1000 returns to step 1006 in which a next vertex pair is loaded. It should be noted that the next vertex pair is loaded but remains on the same frame because the next vertex pair may lie in the same frame.

If the determination at step 1012 is no, the method 1000 continues at step 1014 in which a next frame is loaded. The method 1000 continues at step 1016 in which a determination is made as to whether an end of the scan line has been reached. If the determination at step 1016 is no, the method 1000 returns to step 1010 in which bit data of the next frame is processed. If the determination at step 1016 is yes, the method 1000 ends at step 1018 for the scan line. The method 1000 may be repeated for a next scan line until all of the scan lines have been processed. It is understood that the method 1000 may be implemented using dedicated hardware controller logic to speed up the execution of the steps disclosed above.

Figure 11:
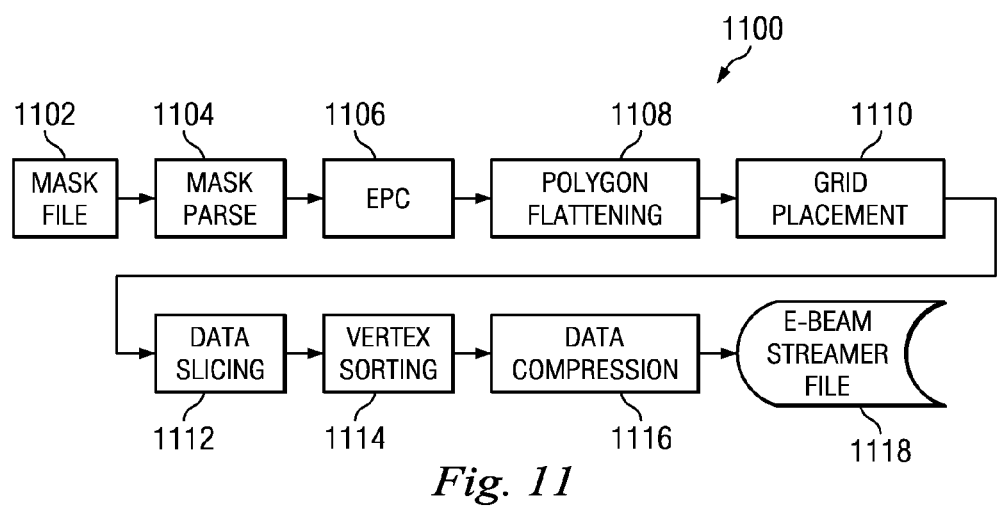
FIG. 11 is a block diagram of an exemplary process 1100 for generating vertex data from pattern layout data according to various aspects of the present disclosure.

Referring to FIG. 11, illustrated is a block diagram of an exemplary process 1100 for generating vertex data from pattern layout data. The process 1100 may be implemented in the mask processing stage 302 of FIG. 3. The process 1100 begins at step 1102 in which the pattern layout data is stored in a mask file using a vector based format such as GDS or OASIS. In an embodiment, GDS stores the mask file as a hierarchical list of polygons. The process 1100 continues at step 1104 in which the mask file is parsed. The process 1100 continues at step 1106 in which electron beam proximity correction (EPC) is performed on the mask file. During the proximity correction process, all the hierarchy is removed and a list of polygons for an entire field remains.

The process 1100 continues at step 1108 in which the polygon shapes are flattened. The flattening process merges any overlapping polygon shapes into a single shape and any double vertices are removed. The process 1100 continues at step 1110 in which the polygons are placed on a writer grid. This process may include dithering of the polygon edges. The process 1100 continues at step 1112 in which the data is sliced. The slicing cuts the entire field into a plurality of stripes for each electron beam. In an embodiment, each stripe is 2 µm in width for each electron beam. The process 1100 continues at step 1114 in which the vertices are sorted for the vertex pair rasterizer (similar to the one 900 shown in FIG. 9). The sorting processes the vertex pairs in a sequence in which they appear on a scan line (see discussion in FIG. 5). The process 1100 continues at step 1116 in which the data may be optionally compressed. The process 1100 continues at step 1118 in which the data, compressed or uncompressed, is saved to an electron beam (E-beam) streamer file format as discussed below.

Figure 12:
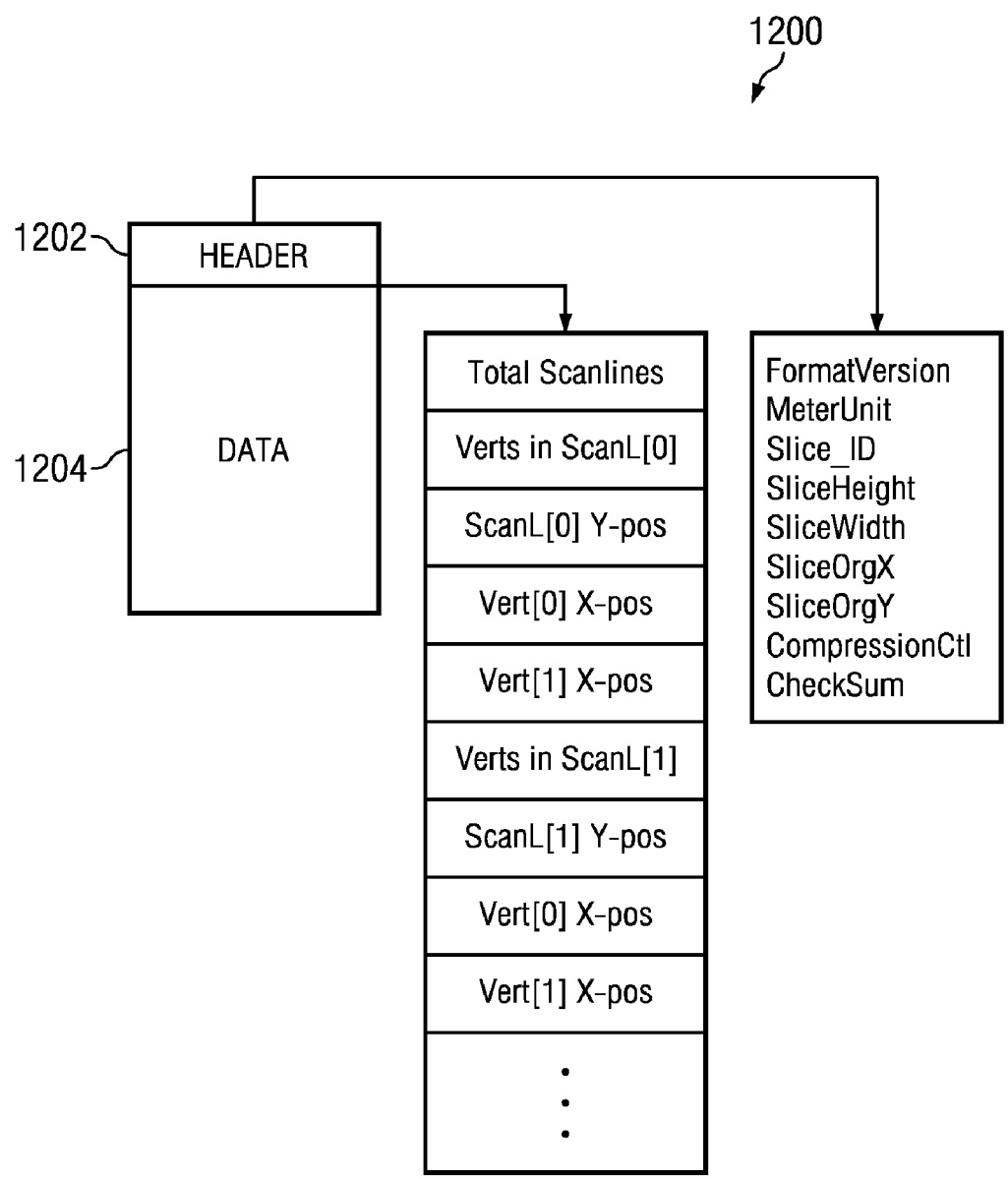
FIG. 12 is an exemplary file format of an Electron beam (E-beam) streamer file according to various aspects of the present disclosure.

Referring to FIG. 12, illustrated is a file format of an E-beam streamer file 1200 according to an embodiment of the present disclosure. The E-beam streamer file 1200 includes a header portion 1202 and a data portion 1204. The header portion 1202 includes information with respect to a format version, meter unit, slice positioning and dimension including slice identification, slice height, slice width, slice origin at X-position, slice origin at Y-position, compression control, and error checking (check sum). The data portion 1204 includes a sorted binary list of all vertices within each scan line in the field. For example, the data portion 1204 includes a total number of scan lines (e.g., Total Scanlines), a number of vertices for each scan line (e.g., Verts in ScanL[0], Verts in ScanL[1], etc.), and a vertex position within each scan line (ScanL[0] Y-pos, Vert[0] X-pos, Vert[1] X-pos; ScanL[1] Y-pos, Vert[0] X-pos, Vert[1] X-pos; etc.). The format of the E-beam streamer file 1200 is defined for the rasterizer module 900 of FIG. 9A to reduce the required memory size and to increase the speed of generating the streaming data (e.g., writing instructions) that is transmitted to the beam controller for controlling the beams.

Aspects of the present disclosure may be implemented in hardware, software, firmware, or a combination thereof. The various elements of the rasterization system may be implemented in, but is not limited to, a central processing unit (CPU), graphics processing unit (GPU), field-programmable gate array, and application-specific integrated circuit (ASIC). Further, the various elements of the system, either individually or in combination, may be implemented in a computer program product tangibly embodied in a machine-readable storage device for execution by a processing unit such as a processor, microcomputer, or digital machine. Various steps of embodiments disclosed herein may be performed by a computer processor executing a program tangibly embodied on a computer-readable medium to perform functions by operating on input and generating output. The computer-readable medium may be, for example, a memory, a transportable memory such as a compact disk, optical disk, or diskette, such that a computer program embodying the aspects of the present invention can be loaded onto a computer system. The computer program is not limited to any particular embodiment, and may, for example, be implemented in an operating system, application program, foreground or background process, driver, network stack, or any combination thereof, executing on a single computer processor or multiple computer processors. Additionally, various steps of embodiments of the present disclosure may provide one or more data structures generated, produced, received, or otherwise implemented on a computer-readable medium such as a memory.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A direct-write (DW) system, comprising:
    a stage for holding a substrate and operable to scan the substrate;
    a data processing module for processing pattern data and generating instructions associated with the pattern data; and
    an exposure module that includes a plurality of beams that are focused onto the substrate and a beam controller that controls the plurality of beams in accordance with the instructions while the substrate is scanned;
    wherein the data processing module includes a plurality of vertex pair processors each having a plurality of bit inverters, wherein each vertex pair processor is operable to process a respective vertex pair of an input scan line to generate an output scan line, wherein each bit inverter is operable to invert a respective input bit of the input scan line to generate a respective output bit of the output scan line if a bit position is located between the respective vertex pair, wherein each bit inverter is operable to copy the respective input bit of the input scan line to generate the respective output bit of the output scan line if the bit position is located outside of the respective vertex pair, wherein the respective input bit is obtained from a previous scan line;

wherein the instructions correspond to the output bits of the output scan line for each beam.

2. The system of claim 1, wherein each vertex pair processor includes a control portion that provides a control signal to the plurality of bit inverters, the control signal corresponding to a position of the respective vertex pair; and wherein each bit inverter compares its position with the position of the respective vertex pair to determine whether the bit position is located between the respective vertex pair.

3. The system of claim 1, wherein the data processing module further includes a mask processing module operable to:

receive the pattern data in a design file format, the pattern data including a list of polygons;

perform electron beam proximity correction on the pattern data;

merge any overlapping polygons to a single polygon shape;

place the polygons onto a writer grid corresponding to a field to be written onto the substrate;

slice the field into a plurality of stripes, wherein each stripe is to be written by each beam and each stripe is divided into a plurality of scan lines; and sort a plurality of vertices to be processed by the vertex pair processors, wherein the polygons have edges that are horizontal or vertical, wherein each vertex includes a transition from a horizontal edge to a vertical edge or a transition from a vertical edge to a horizontal edge.

4. The system of claim 3, wherein the mask processing module is further operable to store the plurality of vertices in a file format that includes a sorted binary list of the vertices within each scan line.

5. The system of claim 1, wherein the data processing unit further includes a data merger for merging the output bits of the output scan line of each of the vertex pair processors.

6. The system of claim 5, wherein the data processing module further includes:

memory for storing the vertex pairs of the input scan line;
memory for storing the input bits of the input scan line; and
memory for storing the merged output bits of the output scan line.

7. The system of claim 1, wherein the output bits of the output scan line are generated in real-time such that the output bits are streamed to the beam controller for controlling a plurality of blankers, each blanker controlling each beam according to the output bits while the substrate is scanned.

8. A method for direct-writing to a substrate, comprising:

providing a pattern layout that includes a plurality of polygons;

slicing the pattern layout into a plurality of stripes, wherein each stripe is associated with a respective beam for writing the stripe onto the substrate and each stripe is partitioned into a plurality of scan lines;

determining a plurality of vertex pairs within each scan line, wherein the polygons have edges that are horizontal or vertical, wherein each vertex includes a transition from a horizontal edge to a vertical edge or a transition from a vertical edge to a horizontal edge; and generating a stream of data corresponding to each scan line, wherein the stream of data controls the respective beam that direct-writes onto the substrate while the substrate is scanned;

wherein generating the stream of data includes processing the vertex pairs by a data processing module, wherein the data processing module includes a plurality of vertex pair processors each having a plurality of bit inverters, wherein each vertex pair processor is operable to process a respective vertex pair of an input scan line to generate an output scan line, wherein each bit inverter is operable to invert a respective input bit of the input scan line to generate a respective output bit of the output scan line if a bit position is located between the respective vertex pair, wherein each bit inverter is operable to copy the respective input bit of the input scan line to generate the respective output bit of the output scan line if the bit position is located outside of the respective vertex pair, wherein the respective input bit is obtained from a previous scan line.

9. The method of claim 8, further comprising:

performing electron beam proximity correction on the pattern layout;

merging any overlapping polygons to a single polygon shape; and placing the polygons onto a writer grid corresponding to a field to be written onto the substrate, wherein slicing the pattern layout includes slicing the field.

10. The method of claim 9, further comprising storing the vertex pairs in a vertex format that includes a sorted binary list of the vertices within each scan line.

11. The method of claim 10, further comprising:

compressing the vertex format data for storing; and
decompressing the vertex format data prior to sending it to the data processing module.

12. The method of claim 8, further comprising merging the output bits of each of vertex pairs processors to generate the output scan line.

13. The method of claim 8, wherein each vertex pair processor includes a control portion that provides a control signal to the plurality of bit inverters, the control signal corresponding to a position of the respective vertex pair; and wherein each bit inverter compares its position with the position of the respective vertex pair to determine whether the bit position is located between the respective vertex pair.

14. The method of claim 8, wherein generating the stream of data is performed in real-time such that the output bits are streamed to a beam controller for controlling a plurality of blankers, each blanker controlling the respective beam according to the output bits while the substrate is scanned.

15. An apparatus for rasterizing pattern data to generate writing instructions for a direct-write system, the apparatus comprising:

M number of vertex pair processors, wherein each vertex pair processor is operable to process a respective vertex pair of an input scan line to generate an output scan line, wherein each vertex pair processor includes:

N number of bit slice inverters, wherein each bit slice inverter is operable to invert a respective input bit of the input scan line to generate a respective output bit of the output scan line if a bit position is located between the respective vertex pair, wherein each bit slice inverter is operable to copy the respective input bit of the input scan line to generate the respective output bit of the output scan line if the bit position is located outside of the respective vertex pair, wherein the respective input bit is obtained from a previous scan line; and a control portion that provides a control signal to the plurality of bit slice inverters, wherein the control signal corresponds to a position of the respective vertex pair within each scan line, wherein each bit slice inverter compares its position with the position of the respective vertex pair to determine whether the bit position is located between the respective vertex pair.

16. The apparatus of claim 15, wherein each bit slice inverter includes:

a comparator portion operable to:
  receive a first input corresponding to the position of the respective vertex pair;
  receive a second input corresponding to the bit position; and
  generate an output corresponding to whether the bit position is located between the position of the respective vertex pair position;

a multiplexer (mux) that includes:
  a first input corresponding to the copied input bit;
  a second input corresponding to the inverted input bit;
  a third input for receiving the output of the comparator portion; and
  an output corresponding to the output bit of the scan line, wherein the third input determines whether the output of the mux corresponds to the first input or the second input.

17. The apparatus of claim 15, wherein each scan line is processed M vertex pairs at a time and wherein each scan line is processed in frames of N at a time.

18. The apparatus of claim 15, further comprising a data merger for merging the output bits of each of the M vertex pair processors to generate the output scan line.

19. The apparatus of claim 18, wherein the merged output bits are streamed to a respective blanker for controlling a respective beam that direct-writes onto a substrate while the substrate is scanned.

20. The apparatus of claim 15, wherein the plurality of vertex pairs within each scan line corresponds to a plurality of polygons of a pattern layout, wherein the polygons have edges that are horizontal or vertical, wherein each vertex includes a transition from a horizontal edge to a vertical edge or a transition from a vertical edge to a horizontal edge.

* * * * *